(12) United States Patent
Wang et al.

(10) Patent No.: US 9,577,658 B1
(45) Date of Patent: Feb. 21, 2017

(54) ANALOG TO DIGITAL CONVERTER AND DATA CONVERSION METHOD

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Ting-Hao Wang, Hsinchu (TW); Jen-Wei Tsai, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/208,623

(22) Filed: Jul. 13, 2016

(30) Foreign Application Priority Data

Mar. 14, 2016 (CN) ............................ 2016 1 014932

(51) Int. Cl.
*H03M 1/12* (2006.01)
*H03K 5/24* (2006.01)

(52) U.S. Cl.
CPC ............... *H03M 1/12* (2013.01); *H03K 5/249* (2013.01)

(58) Field of Classification Search
None
See application file for complete search history.

(56) References Cited

U.S. PATENT DOCUMENTS

| 8,067,976 | B2 * | 11/2011 | Sumita | G05F 3/205 327/535 |
| 8,487,659 | B2 * | 7/2013 | Kapusta | H03M 1/0617 327/12 |
| 9,258,009 | B2 * | 2/2016 | Deguchi | H03M 1/125 |
| 9,467,133 | B2 * | 10/2016 | Chong | H03K 5/2481 |
| 2016/0065229 | A1 * | 3/2016 | Kull | H03K 5/249 341/172 |

* cited by examiner

*Primary Examiner* — Howard Williams
(74) *Attorney, Agent, or Firm* — CKC & Partners Co., Ltd.

(57) ABSTRACT

An analog-to-digital converter includes comparator modules and an encoder module. Each of the comparator modules is configured to compare a reference voltage with an input signal according to a first clock signal to generate a first comparison signal and a second comparison signal, and to generate a detection signal according to a second clock signal, the first comparison signal, and the second comparison signal. A delay duration is present between the first clock signal and the second clock signal. The encoder module is configured to generate a first bit of digital data according to the first comparison signals from the comparator modules, and to generate a second bit of the digital data according to the detection signals from the comparator modules and the first bit.

20 Claims, 7 Drawing Sheets

ANALOG TO DIGITAL CONVERTER AND DATA CONVERSION METHOD

RELATED APPLICATIONS

This application claims priority to China Application Serial Number 201610141932.7 filed Mar. 14, 2016, which is herein incorporated by reference.

BACKGROUND

Technical Field

The present application relates to an analog-to-digital converter (ADC). More particularly, the present application relates to a flash ADC and a data conversion method thereof.

Description of Related Art

Analog-to-digital converters (ADCs) are widely utilized in various electronic products, which include, for example, a signal input interface of a display, a sound card, etc. With different product applications, the overall performance of the products is usually determined by parameters, including the resolution, the operating frequency, or the dynamic range, of the ADCs.

Flash ADCs generally have a faster operating speed, and thus are commonly applied in high-speed applications. A general flash ADC employs comparators to compare reference voltages with an input signal at the same time, to output multiple bit data in parallel. However, with an increasing in the demand of the resolution, the number of the comparators and the number of the reference voltages in the flash ADC are increased. As a result, the circuit area of the flash ADC is too large, and the power consumption thereof are also significantly increased.

SUMMARY

One aspect of the present disclosure provides an analog-to-digital converter (ADC). The ADC includes comparator modules and an encoder module. Each of the comparator modules is configured to compare a reference voltage with an input signal according to a first clock signal to generate a first comparison signal and a second comparison signal, and to generate a detection signal according to a second clock signal, the first comparison signal, and the second comparison signal. A delay duration is present between the first clock signal and the second clock signal. The encoder module is configured to generate a first bit of digital data according to the first comparison signals from the comparator modules, and to generate a second bit of the digital data according to the detection signals from the comparator modules and the first bit.

One aspect of the present disclosure provides a data conversion method. The data conversion method includes following steps: comparing an input signal with each of reference voltages according to a first clock signal, to generate first comparison signals and second comparison signals; generating detection signals according to a second clock signal, the first comparison signals, and the second comparison signals, in which a delay duration is present between the first clock signal and the second clock signal; encoding the first comparison signals to generate a first bit of digital data; and generating a second bit of the digital data according to the detection signals and the first bit.

As described above, the ADC and the data conversion method thereof, which are provided in the present disclosure, generate an additional bit with the operations of the comparison module 140, to significantly reduce the circuit area and the power consumption of the ADC.

BRIEF DESCRIPTION OF THE DRAWINGS

This disclosure can be more fully understood by reading the following detailed description of the embodiment, with reference made to the accompanying drawings as follows.

DETAILED DESCRIPTION

Figure 1:
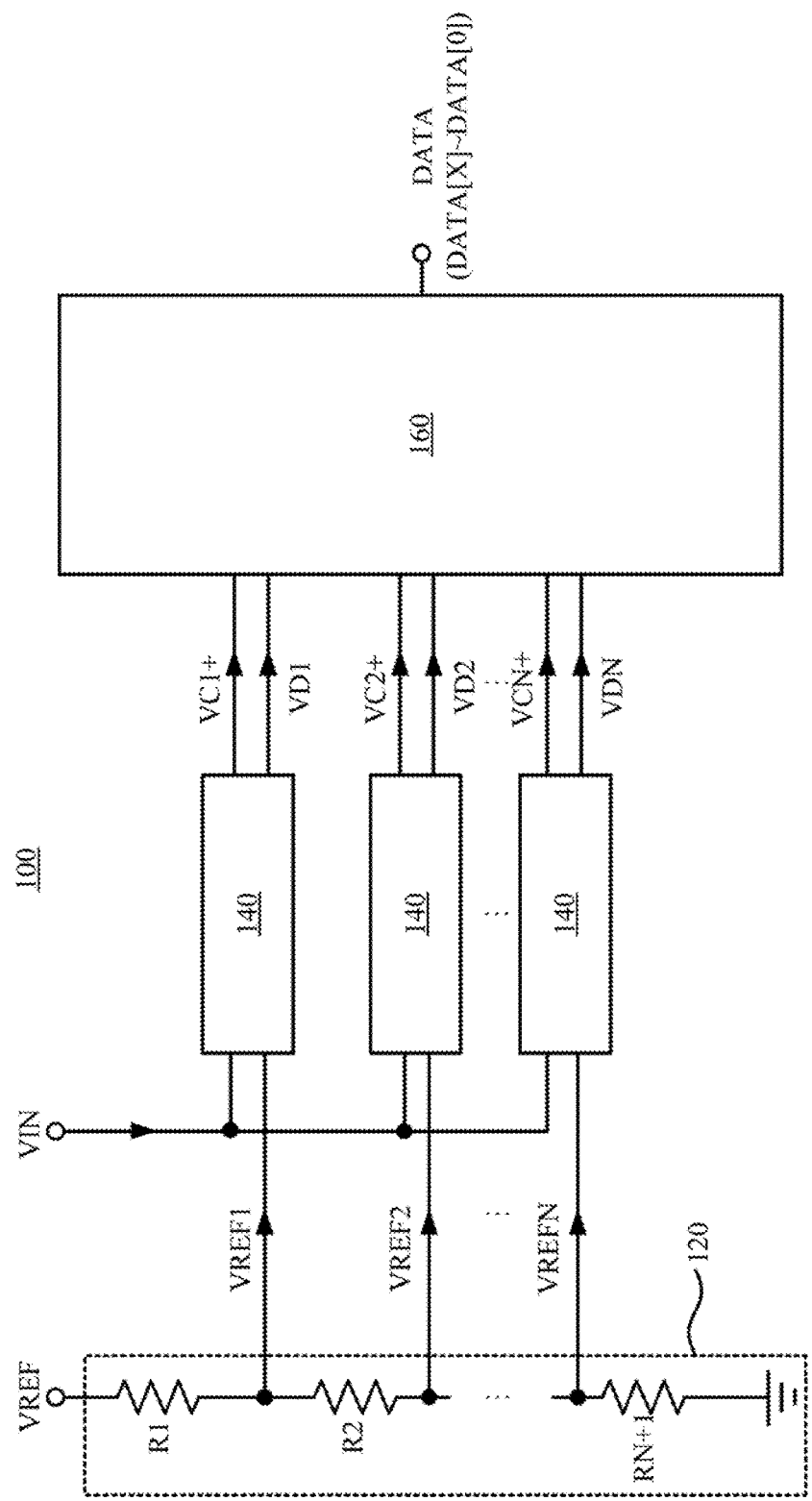
FIG. 1 is a schematic diagram illustrating an analog-to-digital converter, according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Although the terms "first," "second," etc., may be used herein to describe various elements, these elements should not be limited by these terms. These terms are used to distinguish one element from another.

In this document, the term "coupled" may also be termed as "electrically coupled," and the term "connected" may be termed as "electrically connected." "Coupled" and "connected" may also be used to indicate that two or more elements cooperate or interact with each other.

Reference is now made to FIG. 1. FIG. 1 is a schematic diagram illustrating an analog-to-digital converter (ADC) 100, according to some embodiments of the present disclosure. As shown in FIG. 1, the analog-to-digital converter 100 includes a reference voltage circuit 120, comparator modules 140, and encoder modules 160.

The reference voltage circuit 120 is configured to divide a voltage VREF to generate reference voltages VREF1-VREFN. In some embodiments, the reference voltage circuit 120 includes resistors R1-RN+1. The resistors R1-RN+1 are coupled in series to ground, to divide the reference voltage to generate the reference voltages VREF1-VREFN. The arrangements above are given for illustrative purposes only, and various reference voltage circuits that are able to implement the same functions are within the contemplated scope of the present disclosure.

The comparator modules 140 are coupled to the reference voltage circuit 120 to receive the reference voltages VREF1-VREFN. The comparator modules 140 are configured to compare an input signal VIN with the reference voltages VREF1-VREFN, to output comparison signals VC1+-VCN+ and detection signals VD1-VDN.

The encoder modules 160 are coupled to the comparator modules 140 to receive the comparison signals VC1+-VCN+ and the detection signals VD1-VDN. The encoder modules 160 are configured to encode the comparison signals VC1+-VCN+ to generate previous X bits DATA[X]-DATA[1] of digital data DATA, and generate a least significant bit DATA[0] of the digital data DATA according to the detection signals VD1-VDN and the bit DATA[1], in which X is a positive integer.

In some approaches, when a flash analog-to-digital converter is configured to generate digital data having X+1 bits, it is required to employ $2^{(X+1)}-1$ comparator modules. Compared with the approaches above, with the arrangements discussed above in the present disclosure, when generating the digital data having X+1 bits, only $2^X-1$ comparator modules 140 are employed, i.e., N=$2^X-1$. As a result, compared with the approaches above, the circuit area of the analog-to-digital converter 100 can be significantly reduced in a condition that data having the same bits are generated.

Several embodiments will be provided in following paragraphs to describe the function and the application of the comparator modules 140, but the present disclosure is not limited thereto.

Figure 2:
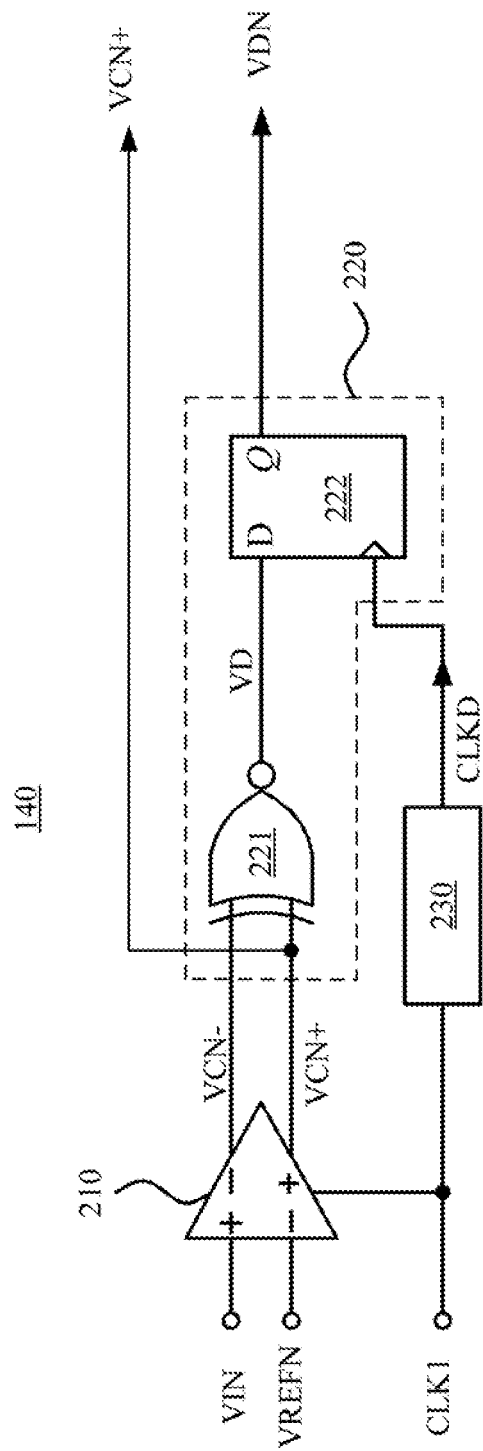
FIG. 2 is a circuit diagram of the comparator module in FIG. 1, according to some embodiments of the present disclosure.

Reference is now made to FIG. 2. FIG. 2 is a circuit diagram of the comparator module 140 in FIG. 1, according to some embodiments of the present disclosure.

As shown in FIG. 2, the comparator module 140 includes a comparator 210, a logic circuit 220, and a delay time circuit 230. The comparator 210 is configured to be reset according to the clock signal CLK1, or to compare the input signal VIN with a corresponding one of the reference voltages VREF1-VREFN to output a corresponding one of the comparison signals VC1+-VCN+ and a corresponding one of the comparison signals VC1--VCN-. For ease of understanding, the following paragraphs and FIG. 2 are described with reference to an N-th comparison module 140 in FIG. 1.

In some embodiments, the comparator 210 may be implemented with a fully differential comparator circuit. With such arrangement, when the comparison is complete, the statuses of the comparison signals VCN+ and VCN- outputted by the comparator 120 are different from each other.

In some embodiments, the logic circuit 220 includes an exclusive or gate 221 having an inverted output (hereinafter XNOR gate 221) and a flip-flop 222. The XNOR gate 221 is coupled to two output terminals of the comparator 210, to receive the comparison signals VCN+ and VCN-. The XNOR gate 221 generates a signal VD according to the comparison signals VCN+ and VCN-.

In some embodiments, the comparator 210 may be implemented with a fully differential comparator circuit. With such arrangement, when the difference between the input signal VIN and the reference voltage VREFN is large, the statuses of the comparison signals VCN+ and VCN- outputted by the comparator 120 are different from each other. Alternatively, when the difference between the input signal VIN and the reference voltage VREFN is small, the comparator 210 cannot compare the difference therebetween immediately. Accordingly, the statuses of the comparison signals VCN+ and VCN- are the same within a transient interval. As a result, the XNOR gate 221 may output the signal VD having different statues, according to the comparison signals VCN+ and VCN-, to indicate the relation between the current input signal VIN and the reference voltage VREFN.

The flip-flop 222 is coupled to the XNOR gate 221 to receive the signal VD. The flip-flop 222 is configured to latch the signal VD, which is outputted by the XNOR gate 221, at a rising edge of a dock signal CLKD, to output the latched signal as the detection signal VDN.

In some embodiments, the flip-flop 222 is positive-edge triggered. In some other embodiments, the flip-flop 222 is negative-edge triggered. Various types of configurations are applicable for the flip-flop 222, and thus are within the contemplated scope of the present disclosure. For ease of understanding, the flip-flop 222 is described as being positive-edge triggered in the following paragraphs of the present disclosure.

Figure 6:
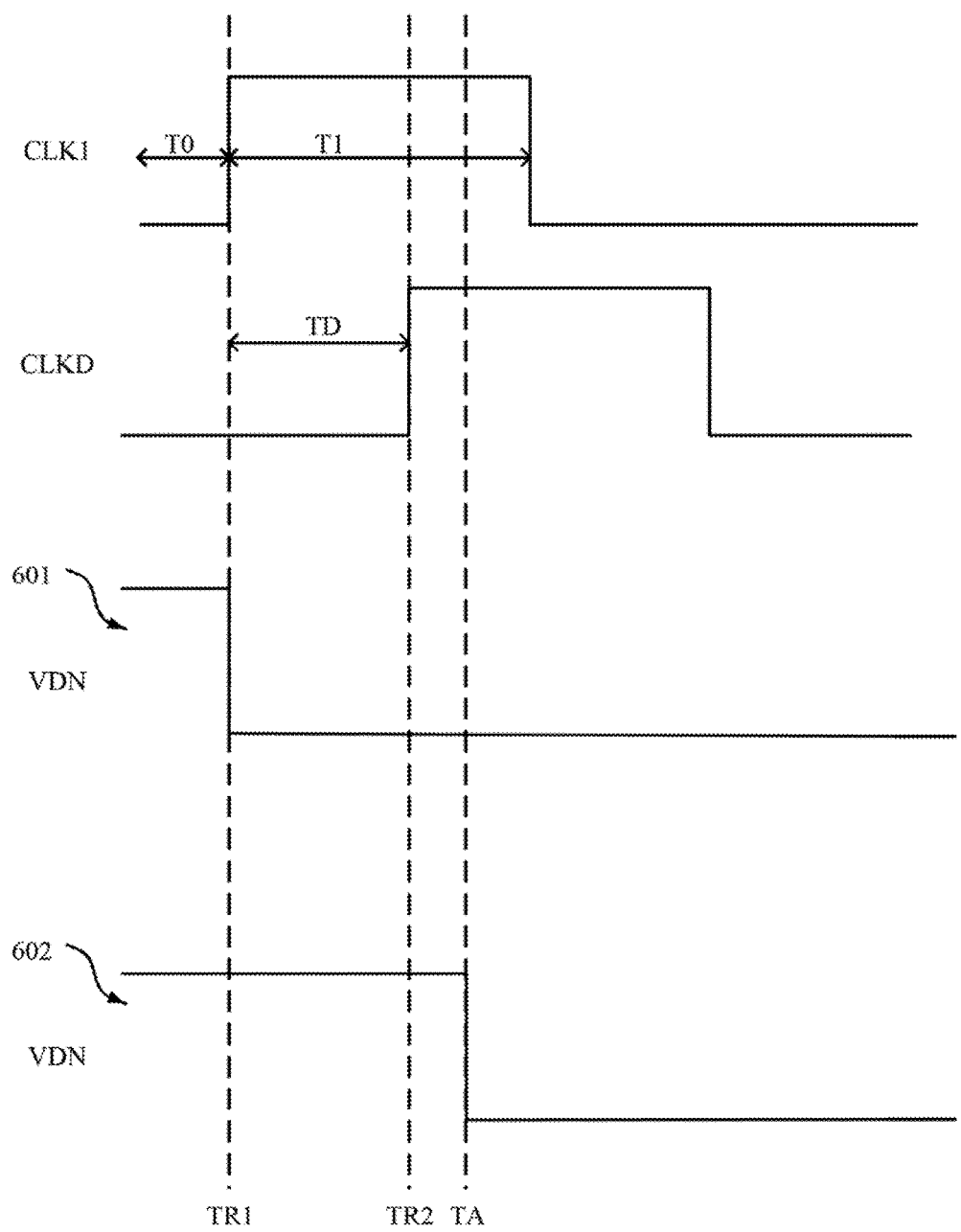
FIG. 6 illustrates a partial enlarged view of timing diagram of the operations, which are performed by the comparator module in FIG. 2, of the method in FIG. 5, according to some embodiments of the present disclosure.

Furthermore, the delay time circuit 230 is configured to delay the clock signal CLK1 for a delay duration TD, to generate the clock signal CLKD. In some embodiments, as shown in FIG. 6 below, the delay duration TD is present between a rising edge, i.e., the transition point at time TR1, of the clock signal CLK1 and a rising edge, i.e., the transition point at time TR2, of the clock signal CLKD. In some embodiments, the delay time circuit 230 may be implemented with multiple series-coupled stages of inverters, but the present disclosure is not limited in this regard.

In some other embodiments, the delay time circuit 230 is independent to the comparison module 140. For example, in some other embodiments, the ADC 100 in FIG. 1 further includes a delay time circuit, which is configured to generate the clock signal CLKD to all of the comparison modules 140 according to the clock signal CLK1. The arrangements of the delay time circuit 230 above are given for illustrative purposes only. Various arrangements of the delay time circuit 230 are within the contemplated scope of the present disclosure.

The arrangement of the XNOR gate 221 is given for illustrative purposes only. Various logic gates, which are able perform the same operations with the XNOR gate 221, are within the contemplated scope of the present disclosure. For example, in some other embodiments, the XNOR gate 221 can be replaced with an AND gate. In still some other embodiments, the XNOR gate 221 can be replaced with a NOR gate. The above logic gates are given for illustrative purposes only, and the present disclosure is not limited in this regard.

Figure 3:
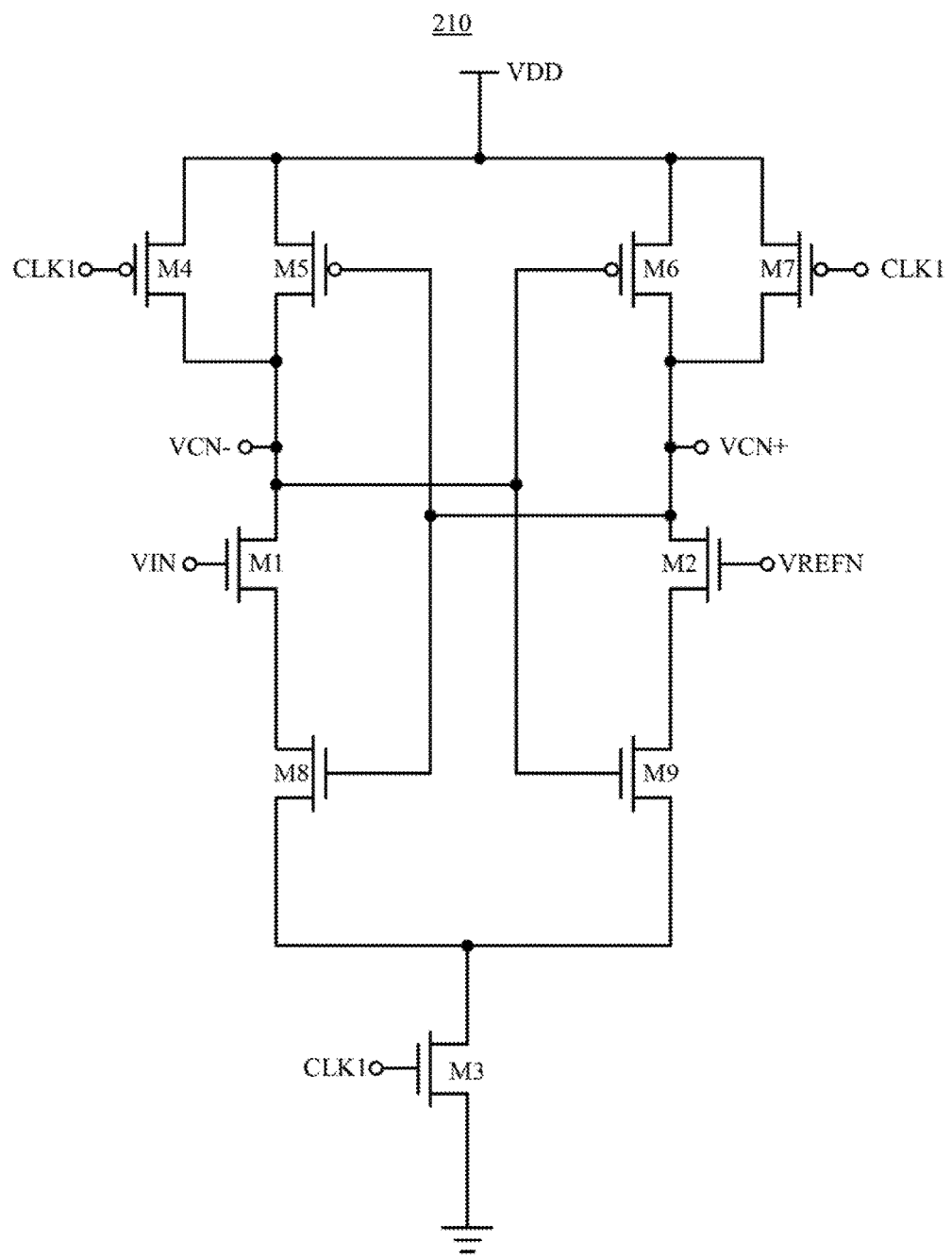
FIG. 3 is a circuit diagram of the comparator in FIG. 2, according to some embodiments of the present disclosure.

Reference is now made to FIG. 3. FIG. 3 is a circuit diagram of the comparator 210 in FIG. 2, according to some embodiments of the present disclosure. In some embodiments, the comparator 210 is a fully differential circuit.

For illustration, as shown in FIG. 3, the comparator 210 includes switches M1-M9. A first terminal of the switch M1 is configured to output the comparison signal VCN-, a second terminal of the switch M1 is coupled to a first terminal of the switch M8, and the control terminal of the switch M1 is configured to receive the input signal VIN. A first terminal of the switch M2 is configured to output the comparison signal VCN+, a second terminal of the switch M2 is coupled to a first terminal of the switch M9, and a control terminal of the switch M2 is configured to receive the reference voltage VREFN. A first terminal of the witch M3 is coupled to a second terminal of the switch M8 and a second terminal of the switch M9, a second terminal of the switch M3 is coupled to ground, and a control terminal of the switch M3 is configured to receive the clock signal CLK1. A first terminal of the switch M4 is configured to receive a voltage VDD, a second terminal of the switch M4 is coupled to the first terminal of the switch M1. And a control terminal of the switch M4 is configured to receive the clock signal CLK1. A first terminal of the switch M5 is configured to receive the voltage VDD, a second terminal of the switch M5 is coupled to the first terminal of the switch M1, and a control terminal of the switch M5 is coupled to the first terminal of the switch M2. A first terminal of the switch M6 is configured to receive the voltage VDD, a second terminal of the switch M6 is coupled to the first terminal of the switch M2, and a control terminal of the switch M6 is coupled to the first terminal of the switch M1. A first terminal of the switch M7 is configured to receive the voltage VDD, a second terminal of the switch M7 is coupled to the first terminal of the switch M2, and a control terminal of the switch M7 is configured to receive the clock signal CLK1. A control terminal of the switch M8 is coupled to the first terminal of the switch M2, and a control terminal of the switch M9 is coupled the first terminal of the switch M1.

With such arrangement, when being at a disabling period (i.e., the time interval of being at a low level) of the clock signal CLK1, the switch M4 and the switch M7 are turned on to transmit the voltage VDD to the first terminal of the switch M1 and the first terminal of the switch M2. Effectively, the comparison signal VCN+ and the comparison signal VCN− are reset to the voltage VDD. When being at an enabling period (i.e., the time interval of being at a high level) of the clock signal CLK1, the switch M4 and the switch M7 are turned off, and the switch M3 is turned on. Accordingly, the comparator 210 is thus able to compare the input signal VIN with the reference voltage VREFN.

Moreover, as shown in FIG. 3, the arrangements of the switches M1, M2, M5, M6, M8, and M9 form a positive feedback. With such arrangements, when a sufficient difference is present between the input signal VIN and the reference voltage VREF, the comparator 210 can output the comparison signal VCN+ and the comparison signal VCN−, which have different statuses, efficiently.

The above arrangements of the comparator 210 are given for illustrative purposes only. Various types of the fully differential comparator are within the contemplated scope of the present disclosure.

Figure 4:
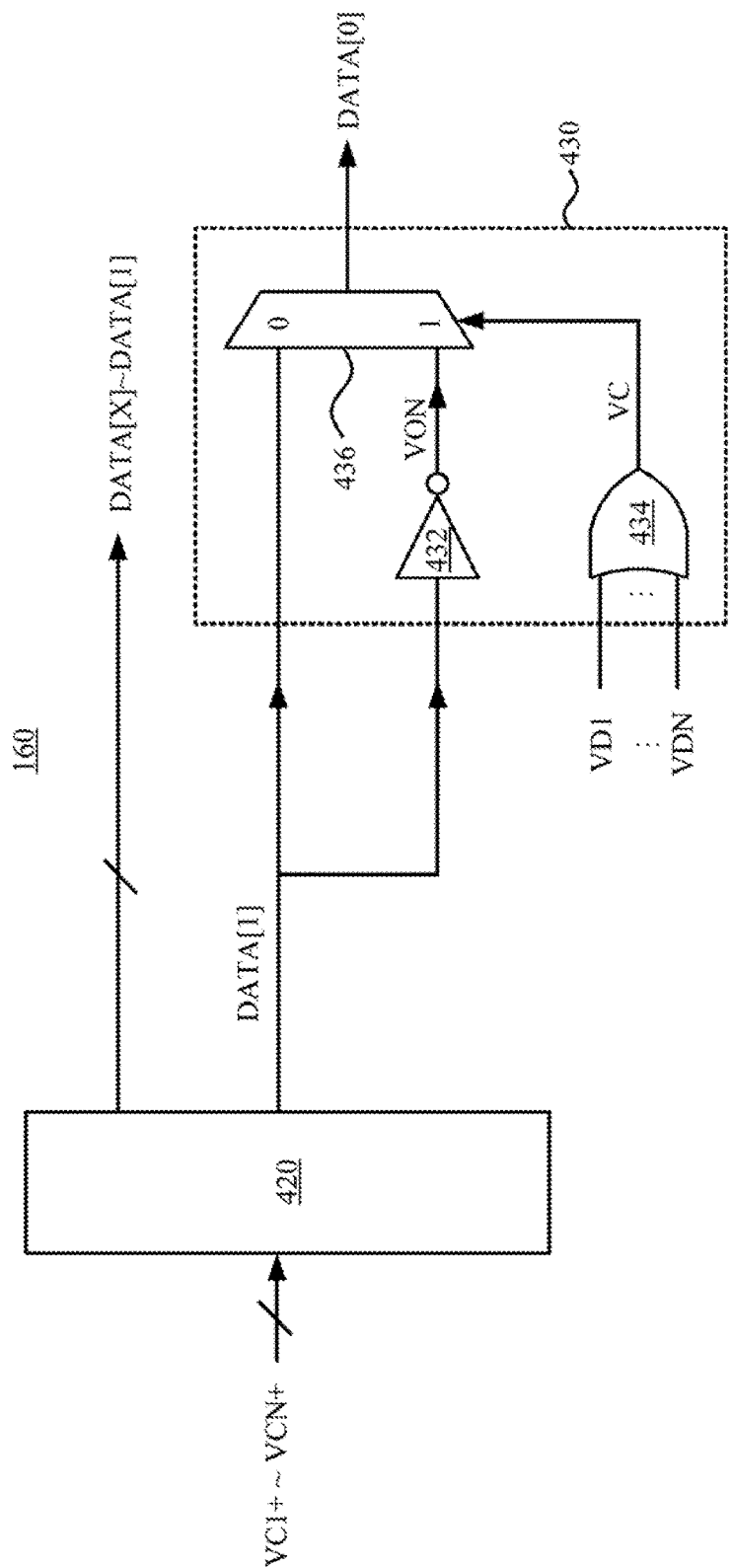
FIG. 4 is a circuit diagram of the encoder module in FIG. 1, according to some embodiments of the present disclosure.

FIG. 4 is a circuit diagram of the encoder module 160 in FIG. 1, according to some embodiments of the present disclosure.

In some embodiments, the encoder module 160 includes an encoder 420 and a logic circuit 430. The encoder 420 is configured to encode the comparison signals VC1+-VCN+, to generate previous X bits DATA[X]-DATA[1] of the digital data DATA.

In various embodiments, the encoder 420 may be implemented with various digital circuits, and may perform various kinds of digital encoding, e.g., binary coding or thermometer coding. The configurations above are given for illustrative purposes only, and various encoders that are able to implement the same functions are within the contemplated scope of the present disclosure.

The logic circuit 430 includes an inverter 432, an OR gate 434, and a multiplexer 436. The inverter 432 outputs an inverted output signal VON according to the bit DATA[1], in which the status of the inverted output signal VON is different from the status of the bit DATA[1]. The OR gate 434 generate the control signal VC according to the detection signals VD1-VDN. The multiplexer 436 selects one of the bit DATA[1] and the inverted output signal VON according to the control signal VC, to output the selected one as the bit DATA[0].

The above arrangements of the logic circuit 430 are given for illustrative purposes only. Various arrangements that are able to have the same function with the logic circuits are also within the contemplated scope of the present disclosure.

Figure 5:
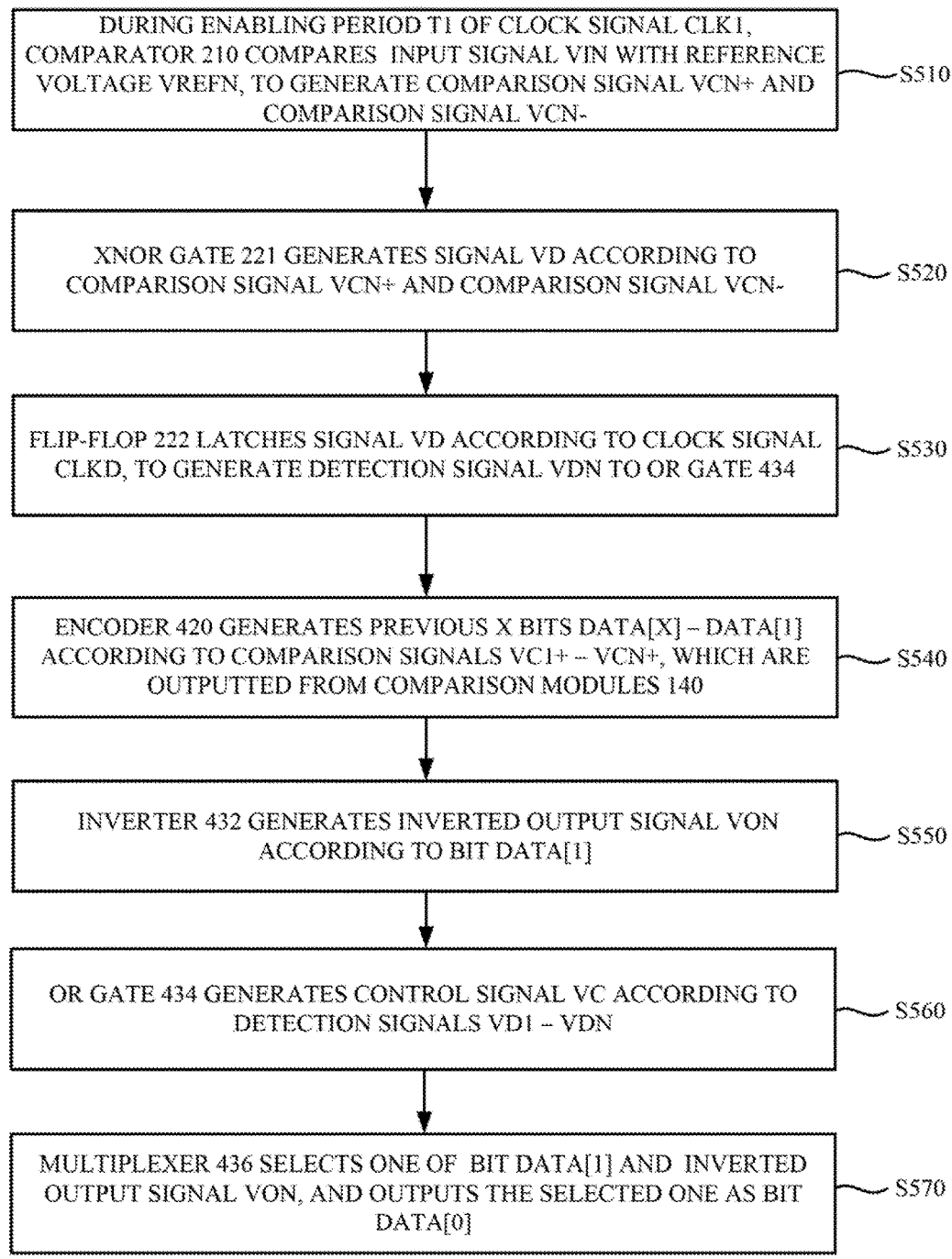
FIG. 5 is a flow chart of a data conversion method according to the some embodiments of the present disclosure.

FIG. 5 is a flow chart of a data conversion method 500 according to the some embodiments of the present disclosure. FIG. 6 illustrates a partial enlarged view of timing diagram of the operations, which are performed by the comparator module in FIG. 2, of the method in FIG. 5, according to some embodiments of the present disclosure. For ease of understanding, reference is now made to FIG. 1, FIG. 2, FIG. 4, FIG. 5, and FIG. 6, and the operations of the comparator module 140 are described with the data conversion method 500.

As shown in FIG. 5, the data conversion method 500 includes steps S510-S570. In step S510, during the enabling period T1 of the clock signal CLK1, the comparator 210 compares the input signal VIN with the reference voltage VREFN, to generate the comparison signal VCN+ and the comparison signal VCN−. In step S520, the XNOR gate 221 generates the signal VD according to the comparison signal VCN+ and the comparison signal VCN−. In step S530, the flip-flop 222 latches the signal VD according to the clock signal CLKD, to generate the detection signal VDN to the OR gate 434.

As shown in FIG. 6, during the disabling period T0 of the clock signal CLK1, the comparison signal VCN+ and the comparison signal VCN− are reset to the level of the voltage VDD. During the enabling period T1 of the clock signal CLK1, the comparator 210 compares the input signal VIN with the reference voltage VREFN. If the difference between the input signal VIN and the reference voltage VREFN is large enough, both of the comparison signal VCN+ and the comparison signal VCN− are pulled to be different statuses in the delay duration TD.

For illustration, when the input signal VIN is larger than the reference voltage VREFN, and the difference between thereof is large enough, the comparison signal VCN+ has the value of logic 1, and the comparison signal VCN− has the value of logic 0. Under this condition, as illustrated as the waveform 601, the detection signal VDN is transited to a low voltage level in the delay duration TD. Accordingly, the flip-flop 222 outputs the detection signal VDN having the low voltage level (which corresponds to the value of logic 0) after the delay duration TD (i.e., time TR2).

On the other hand, if the difference between the input signal VIN and the reference voltage VREFN is not large enough, the comparison signal VCN+ and the comparison signal VCN− cannot be pulled to be different statuses in the delay duration TD. Under this condition, both of the comparison signal VCN+ and the comparison signal VCN− have the values of logic 1. As illustrated as the waveform 602, the detection signal VDN is still at a high voltage level during the delay duration TD, and is transited to be the low voltage level at time TA. Accordingly, the flip-flop 222 outputs the detection signal VDN having the high voltage level (which corresponds to the value of logic 1). Thus, by obtaining the status of the detection signal VDN after the delay duration TD, the relation between the input signal VIN and the reference voltage VREFN can be obtained.

With continued reference to FIG. 5, in step S540, the encoder 420 generates previous X bits DATA[X]-DATA[1] according to the comparison signals VC1+-VCN+, which are outputted from the comparison modules 140. In step 550, the inverter 432 generates the inverted output signal VON according to the bit DATA[1]. In step S560, the OR gate 434 generates the control signal VC according to the detection signals VD1-VDN. In step S570, the multiplexer 436 selects one of the bit DATA[1] and the inverted output signal VON, and outputs the selected one as the bit DATA[0].

For illustration, as discussed above, when the difference between the input signal VIN and the reference voltage VREFN is large enough, the comparison signal VCN+ already has the value of logic 1, and the detection signal VDN (e.g., the waveform 601 in FIG. 6) already has the value of logic 0 in the delay duration TD. By analogy, when differences between the input signal VIN and each of the reference voltage VREF1-VREFN are large enough, all of the detection signals VD1-VDN have the values of logic 0.

Under this condition, the encoder 420 outputs the previous X bits DATA[X]-DATA[1] having the values of logic 1. As the bit DATA[1] has the value of logic 1, the inverter 432 thus outputs the inverted output signal VON having the value of logic 0. Meanwhile, as the detection signals VD1-VDN have the value of logic 0, the OR gate thus outputs the control signal VC having the value of logic 0. As a result, the multiplexer 436 selects the bit DATA[1] according to the control signal VC, and outputs the bit DATA[0] having the value of logic 1.

Alternatively, the difference between the input signal VIN and the reference voltage VREFN is not large enough, and differences between the input signal VIN with each of the previous N−1 reference voltages VREF1-VREFN−1 are large enough. Under this condition, the comparison signal VCN+ has the value of logic 1, and the detection signal VDN (e.g., the waveform 602 in FIG. 6) still has the value of logic 1 in the delay duration TD. As discussed above, when differences between the input signal VIN and each of the previous reference voltage VREF1-VREFN−1 are large enough, the detection signals VD1-VDN−1 have the values of logic 0 in the delay duration TD.

Under this condition, the encoder 420 outputs the previous X bits DATA[X]-DATA[1] having the values of logic 1. Since the bit DATA[1] has the value of logic 1, the inverter 432 thus outputs the inverted output signal VON having the value of logic 0. Meanwhile, as the detection signal VDN has the value of logic 1, the OR gate 432 thus outputs the control signal VC having the value of logic 1. As a result, the multiplexer 436 selects the inverted output signal VON according to the control signal VC, and outputs the bit DATA[0] having the value of logic 0.

Figure 7:
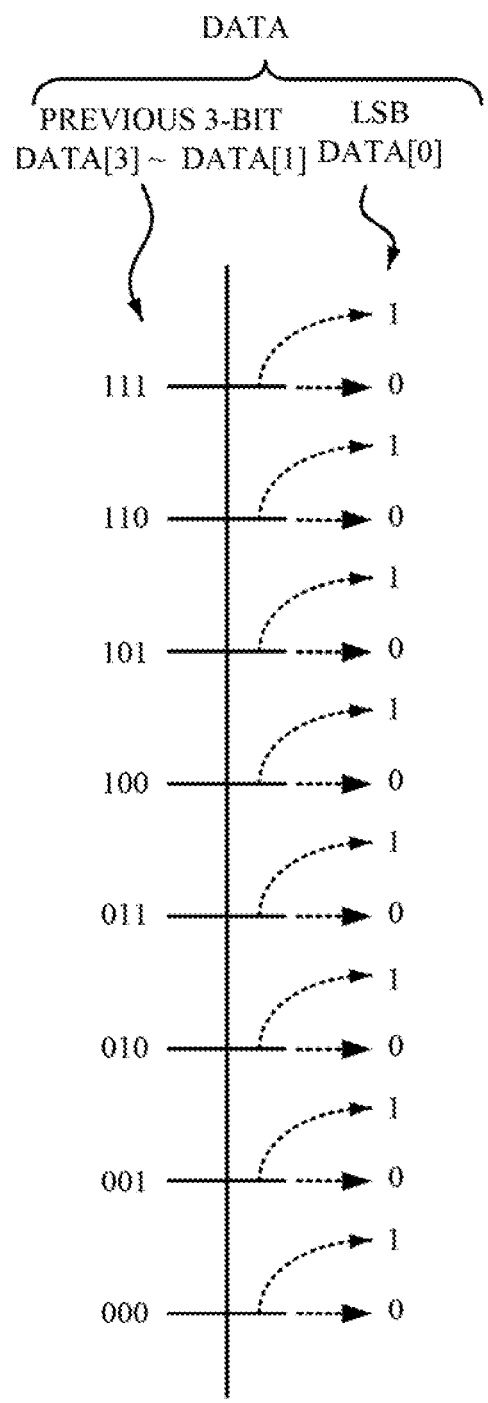
FIG. 7 is a schematic diagram illustrating the operation of generating the digital data according to some embodiments of the present disclosure.

FIG. 7 is a schematic diagram illustrating the operation of generating the digital data DATA, according to some embodiments of the present disclosure. For example, the ADC 100 in FIG. 1 is applied to generate digital data DATA having 4 bits, i.e., X=3. With the above operations of the method 500, the encoder module 160 can generate the previous 3-bit DATA[3]-DATA[1] of the digital data DATA by using the comparison signals VC1+-VCN+. The encoder module 160 can determine the least significant bit (LSB) DATA[0] of the digital data DATA according to the detection signals VD1-VDN.

For illustration, as shown in FIG. 7, the previous 3-bit of the digital data DATA, which corresponds to the input signal VIN, are determined to be "011." When a difference between the input signal VIN and the corresponding reference voltage VREFN is large enough, as discussed above, the control signal VC has the value of logic 0. The multiplexer 436 selects the bit DATA[1] and outputs the bit DATA[0] having the logic value of 1. The encoder module 160 thus combines the previous 3-bit "011" and the bit DATA[O], to generate the complete 4-bit of the digital data DATA as "0111." Similarly, when the difference between the input signal VIN and the corresponding voltage VREFN is not large enough, as discussed above, the control signal VC has the value of logic 1. The multiplexer 436 selects the inverted output signal VON and outputs the bit DATA[0] having the logic value of 0. The encoder module 160 thus combines the previous 3-bit "011" and the bit DATA[0], to generate the complete 4-bit of the digital data DATA as "0110."

Effectively, with the arrangements of the comparison module 140, information of the least significant bit of the digital data DATA is determined with an interpolation. Therefore, the ADC 100 of the present disclosure can generate the digital data DATA having X+1 bits with only $2^X-1$ comparators 210. As described above, the flash ADC in prior art requires $2^{(X+1)}-1$ comparators and the same number of the reference voltages, to generate digital data having X+1 bits. Compared with the flash ADC in the prior art, the circuit area and the power consumption of the ADC 100 can be reduced.

The above description of the data conversion method 500 includes exemplary operations, but the operations of the method 500 are not necessarily performed in the order described. The order of the operations of the data conversion method 500 disclosed in the present disclosure are able to be changed, or the operations are able to be executed simultaneously or partially simultaneously as appropriate, in accordance with the spirit and scope of various embodiments of the present disclosure.

As described above, the ADC 100 and the data conversion method 500 thereof, which are provided in the present disclosure, generate an additional bit with the operations of the comparison module 140, to significantly reduce the circuit area and the power consumption of the ADC.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An analog-to-digital converter, comprising:
    a plurality of comparator modules, wherein each of the comparator modules is configured to compare a reference voltage with an input signal according to a first clock signal to generate a first comparison signal and a second comparison signal, and to generate a detection signal according to a second clock signal, the first comparison signal, and the second comparison signal, wherein a delay duration is present between the first clock signal and the second clock signal; and
    an encoder module configured to generate a first bit of digital data according to the first comparison signals from the comparator modules, and to generate a second bit of the digital data according to the detection signals from the comparator modules and the first bit.

2. The analog-to-digital converter of claim 1, wherein one of the comparator modules comprises:
    a comparator configured to compare the reference voltage and the input signal during an enabling period of the first clock signal, to generate the first comparison signal and the second comparison signal; and
    a logic circuit configured to generate the detection signal during an enabling period of the second clock signal according to the first comparison signal and the second comparison signal.

3. The analog-to-digital converter of claim 2, wherein the comparator is a fully differential circuit.

4. The analog-to-digital converter of claim 2, wherein the delay duration is configured to present between a rising edge of the first clock signal and a rising edge of the second clock signal.

5. The analog-to-digital converter of claim 2, wherein the logic circuit comprises:
a logic gate configured to generate a signal according to the first comparison signal and the second comparison signal; and
a flip-flop configured to latch the signal at a rising edge of the second clock signal, to output the detection signal.

6. The analog-to-digital converter of claim 5, wherein the one of the comparator modules further comprises:
a delay time circuit configured to delay the first clock signal to generate the second clock signal.

7. The analog-to-digital converter of claim 5, wherein the logic gate comprises an exclusive OR gate having an inverted output.

8. The analog-to-digital converter of claim 5, wherein the logic gate comprises an AND gate.

9. The analog-to-digital converter of claim 5, wherein the logic gate comprises a NOR gate.

10. The analog-to-digital converter of claim 2, wherein the digital data is configured to have X+1 bits including the first bit and the second bit, X is a positive integer, and a number of the comparator is $2^X-1$.

11. The analog-to-digital converter of claim 1, wherein the encoder module further comprises:
an encoder configured to generate the first bit of the digital data according to the first comparison signals from the comparator modules; and
a logic circuit configured to generate the second bit of the detection signals from the comparator modules and the first bit.

12. The analog-to-digital converter of claim 11, wherein the logic circuit comprises:
an inverter configured to output an inverted output signal according to the first bit;
an OR gate configured to generate a control signal according to the detection signals from the comparator modules; and
a multiplexer configured to select one of the first bit and the inverted output signal according to the control signal, to output the second bit.

13. The analog-to-digital converter of claim 1, further comprising:
a reference voltage circuit configure to divide a first voltage to generate the reference voltage.

14. A data conversion method, comprising:
comparing an input signal with each of a plurality of reference voltages according to a first clock signal, to generate a plurality of first comparison signals and a plurality of second comparison signals;
generating a plurality of detection signals according to a second clock signal, the first comparison signals, and the second comparison signals, wherein a delay duration is present between the first clock signal and the second clock signal;
encoding the first comparison signals to generate a first bit of digital data; and
generating a second bit of the digital data according to the detection signals and the first bit.

15. The data conversion method of claim 14, wherein the step of generating the first comparison signals and the second comparison signals comprises:
comparing the input signal with each of the reference voltages during an enabling period of the first clock signal, to generate the first comparison signals and the second comparison signals.

16. The data conversion method of claim 15, wherein the step of generating the detection signals comprises:
generating, by a plurality of logic gates, a plurality of signals according to the first comparison signals and the second comparison signals; and
latching, by a plurality of flip-flops, the signals at a rising edge of the second clock signal, to output the detection signals,
wherein the delay duration is configured to be present between a rising edge of the first clock signal and the rising edge of the second clock signal.

17. The data conversion method of claim 14, further comprising:
delaying, by a delay time circuit, the first clock signal, to generate the second clock signal.

18. The data conversion method of claim 14, wherein the step of generating the second bit comprises:
outputting an inverted output signal according to the first bit, wherein a logical status of the first bit is different from a logical status of the inverted output signal;
generating a control signal according to the detection signals; and
selecting one of the first bit and the inverted output signal according to the control signal, to output the second bit.

19. The data conversion method of claim 14, further comprising:
dividing a first voltage to generate the reference voltages.

20. The data conversion method of claim 14, wherein the first comparison signals and the second comparison signals are generated by a plurality of comparators, the digital data is configured to have X+1 bits including the first bit and the second bit, X is a positive integer, and a number of the comparator is $2^X-1$.

* * * * *